(12) United States Patent
Schade et al.

(10) Patent No.: US 10,283,821 B2
(45) Date of Patent: May 7, 2019

(54) BATTERY AND METHOD FOR OPERATING SAME

(71) Applicants: Fraunhofer-Gesellschaft Zur Förderung Der Angewandten Forschung E.V., Munich (DE); Stöbich Technology GmbH, Goslar (DE)

(72) Inventors: Wolfgang Schade, Goslar (DE); Jochen Stöbich, Goslar (DE)

(73) Assignees: Fraunhofer-Gesellschaft Zur Forderung Der Angewandten Forschung E.V., Munich (DE); Stobich Technology GmbH, Goslar (DE)

( * ) Notice: Subject to any disclaimer, the term of this patent is extended or adjusted under 35 U.S.C. 154(b) by 73 days.

(21) Appl. No.: 15/514,976

(22) PCT Filed: Sep. 28, 2015

(86) PCT No.: PCT/EP2015/072229
§ 371 (c)(1),
(2) Date: Mar. 28, 2017

(87) PCT Pub. No.: WO2016/050679
PCT Pub. Date: Apr. 7, 2016

(65) Prior Publication Data
US 2018/0248233 A1   Aug. 30, 2018

(30) Foreign Application Priority Data

Sep. 29, 2014   (DE) .......... 10 2014 219 720

(51) Int. Cl.
*H02J 7/00* (2006.01)
*H01M 10/48* (2006.01)
(Continued)

(52) U.S. Cl.
CPC .......... *H01M 10/482* (2013.01); *G01K 11/32* (2013.01); *G01L 1/246* (2013.01);
(Continued)

(58) Field of Classification Search
CPC .................................................. H01M 10/482
(Continued)

(56) References Cited

U.S. PATENT DOCUMENTS

| 6,740,866 | B1 | 5/2004 | Bohnert et al. |
| 2014/0203783 | A1* | 7/2014 | Kiesel .................. H01M 10/42 320/134 |
| 2015/0219848 | A1 | 8/2015 | Schade |

FOREIGN PATENT DOCUMENTS

| AU | 2010257718 A1 | 12/2011 |
| KR | 100812742 B1 | 3/2008 |

OTHER PUBLICATIONS

International Search Report dated Mar. 30, 2016 (PCT/EP2015/072229).
(Continued)

*Primary Examiner* — Suresh Memula
(74) *Attorney, Agent, or Firm* — Alix, Yale & Ristas, LLP

(57) ABSTRACT

The invention relates to a battery comprising a battery housing and at least one battery cell and at least one fiber optic sensor which has at least one waveguide with a core and a material surrounding said core. At least one fiber Bragg grating is introduced in the core and is mechanically coupled to the battery housing and/or to the battery cell in order to detect a change in size of the battery housing and/or of the battery cell. At least a second fiber Bragg grating is introduced in the core and is mechanically decoupled from the battery housing and the battery cell. The invention further relates to a method for the open loop or closed loop (Continued)

control of the charging and/or discharging of a battery, measurement values being acquired by at least one fiber optic sensor.

16 Claims, 5 Drawing Sheets

(51) Int. Cl.
    *G01K 11/32*     (2006.01)
    *G01L 1/24*     (2006.01)
    *G01R 31/36*     (2019.01)
    *H01M 10/44*     (2006.01)

(52) U.S. Cl.
    CPC ........ *G01R 31/3606* (2013.01); *H01M 10/44* (2013.01); *H01M 10/48* (2013.01); *H01M 10/486* (2013.01); *H02J 7/007* (2013.01)

(58) Field of Classification Search
    USPC ......................................................... 320/134
    See application file for complete search history.

(56) References Cited

OTHER PUBLICATIONS

Lung Lo, Yu, "Using in-fiber Bragg-grating sensors for measuring axial strain and temperature simultaneously on surfaces of structures," Society of Photo-Optical Instrumentation Engineers, 37(8) 2272-2276 (Aug. 1998).

Sommer, Lars Wilko et al., "Embedded Fiber Optic Sensing for Accurate State Estimation in Advanced Battery Management Systems," Materials Research Society, vol. 1681 (2014).

\* cited by examiner

BATTERY AND METHOD FOR OPERATING SAME

FIELD OF THE DISCLOSURE

The application relates to a battery having a battery housing and at least one battery cell and at least one sensor. The invention also relates to a method for the open loop or closed loop control of the charging and/or discharging of a battery having at least one battery cell where measured values are detected by at least one sensor. Devices and methods of this kind can be used to optimize the charging or discharging of a battery and/or to protect the battery against destruction.

BACKGROUND

WO 2012/098159 A2 discloses such a device and a method. This known battery detects the temperature of each battery cell by a fiber-optic sensor. This allows a large number of measurement points and a measurement which is not affected by EMC influences. The strain of the battery cells with charge and/or discharge current can be concluded from the temperature thereof, as a result of which the gradual deterioration of individual cells of the battery is identifiable.

However, this known device does not allow the measurement of the state of charge, i.e. the determination of the charge stored in the individual battery cells.

SUMMARY

Proceeding from the prior art, the object of the invention is therefore to provide a battery and a method for the open loop or closed loop control thereof, by means of which the charge stored in the respective battery cell can be determined. Another object of the invention is to provide a battery where the failure of individual battery cells is detected at an early stage. As a result, the fire protection of such a battery can be improved.

According to the invention, the object is achieved by a battery according to claim 1 and a method for the open loop or closed loop control according to claim 14. Advantageous developments of the invention are described in the subclaims.

The invention proposes to provide a battery with a battery housing which contains at least one battery cell. In some embodiments of the invention, the battery housing can consist of metal, an alloy or a plastic material and have an optional fiber reinforcement. The battery housing can be made e.g. in an injection molding process. The battery housing can have a flame-retardant equipment and/or partition walls, as a result of which the battery housing is suitable to prevent a fire of a battery cell from spreading to the entire battery and/or a vehicle or building containing the battery.

The at least one battery cell is provided to convert chemical energy into electric energy. For example, the battery cell can comprise at least one secondary cell. In some embodiments of the invention, the battery cell can be, or contain, a lithium-polymer cell, a nickel-cadmium cell, a nickel-metal hydride cell or a sodium-nickel chloride cell. If the battery contains a plurality of battery cells, they can be interconnected serially and/or in parallel in order to thus increase the electric voltage provided by the battery and/or the electric current that can be drawn from the battery.

The battery is provided with at least one sensor which detects the size and/or the size change in the battery cell or the battery housing. According to the invention, it was found that the battery cell is not only heated when a charge or discharge current flows but that there is also a mechanical expansion of the battery cell in accordance with the state of charge. This mechanical expansion can be detected by the proposed sensor, as a result of which the measurement of the mechanical expansion renders possible to draw conclusions regarding the state of charge and/or the charge current and/or the discharge current. A damage or a threatening failure of a battery cell due to an excessively large expansion can also be detected at an early stage.

In some embodiments of the invention, the sensor can detect a mechanical stress which is induced when the size of the battery cell or of the battery housing changes. In some embodiments of the invention, the sensor can contain, or consist of, a strain gage.

In some embodiments of the invention, the sensor can be configured to additionally detect a temperature. Due to the detection of temperature and mechanical expansion, conclusions can be drawn regarding the state of charge and/or the charge current and/or the discharge current with higher accuracy.

The data of the sensor can be used to control the charge and/or discharge current of the battery and/or individual battery cells or to switch off individual battery cells in the case of a threatening deep discharge or threatening overcharge before a battery catches fire.

In some embodiments of the invention, the sensor can be a fiber-optic sensor which has at least one waveguide including at least one core and a cladding surrounding the core. In some embodiments of the invention, the waveguide can consist of glass or a plastic material, the core having a first index of refraction and the cladding having a second index of refraction. The indices of refraction of core and cladding are selected in such a way that a total reflection occurs at the interface between core and cladding. As a result, an optical signal can be guided in the core.

In individual, predeterminable longitudinal portions of the waveguide, the core has periodic regions which have a modified index of refraction compared to the surrounding material of the core. The periodic regions can be obtained by irradiation with a laser, e.g. a short-pulse laser can be used. A plurality of such regions forms a fiber Bragg grating which reflects a predeterminable wavelength or a predeterminable wavelength range of the electro-magnetic spectrum and transmits other radiation. The reflected wavelength and/or the reflected wavelength range can be referred to as a Bragg wavelength. The Bragg wavelength is dependent on the distance of the periodic ranges, i.e. from the grating constant of the fiber Bragg grating.

In some embodiments of the invention, the waveguide can contain at least one first fiber Bragg grating and at least one second fiber Bragg grating. Here, the first fiber Bragg grating is mechanically coupled to the battery housing and/or the battery cell and the second fiber Bragg grating is mechanically decoupled from the battery housing or the battery cell. The grating constant of the fiber Bragg grating and thus the Bragg wavelength changes when the waveguide expands or shrinks. Such expansions can occur thermally when there is a temperature change and also mechanically when the waveguide of the fiber-optic sensor is exposed to a mechanical stress. The invention now proposes to determine the temperature of the battery housing and/or the battery cell by determining the Bragg wavelength of the second fiber Bragg grating and to determine a mechanical stress of the battery housing or the battery cell by determining the Bragg wavelength of the first fiber Bragg grating, said stress influencing the waveguide of the fiber-optic sensor by expanding the battery housing or the battery cell. It was found according to the invention that the battery cell is not only heated when a charge or discharge current flows but also a mechanical expansion of the battery cell occurs in accordance with the state of charge. This mechanical expansion can be detected by the fiber-optic sensor with high accuracy and reliability, as a result of which the detection of temperature and mechanical expansion renders possible to draw conclusions regarding the state of charge and/or the charge current and/or the discharge current. Compared to an electric detection of the measured variables by means of resistance sensors, the fiber-optic measurement has a higher accuracy and/or a better EMC compatibility.

In some embodiments of the invention, the second fiber Bragg grating can be arranged in a cavity. This allows a relative shift between the longitudinal portion of the waveguide, which contains the second fiber Bragg grating, and the battery housing and/or the battery cell, as a result of which no mechanical stresses are introduced into the second fiber Bragg grating. This serves to render possible a reliable temperature measurement.

In some embodiments of the invention, at least the longitudinal portion of the waveguide, which contains the second fiber Bragg grating, can run in a tube. The tube can be embedded in the wall of the battery housing and/or a battery cell or be connected to the battery housing and/or the battery cell. In some embodiments of the invention, such a connection can be achieved by adhesion, welding or encapsulation by injection molding or lamination. In the final assembly of the fiber-optic sensor, the waveguide can be passed through the tube, as a result of which at least the second fiber Bragg grating is placed inside the tube in such a way that a relative shift is rendered possible between waveguide and battery housing, thus leaving the second fiber Bragg grating unaffected by mechanical stresses.

In some embodiments of the invention, at least the longitudinal portion of the waveguide, which contains the second fiber Bragg grating, can be provided with a fiber reinforcement. In some embodiments of the invention, the fiber reinforcement can contain, or consist of, glass fibers and/or carbon fibers and/or aramid fibers. The fiber reinforcement avoids an excessive expansion of the waveguide when mechanical stresses exert an influence, as a result of which the second fiber Bragg grating substantially responds to temperature changes. Therefore, the separate determination of mechanical stress and thus expansion of the battery housing and/or of the battery cell and temperature are rendered possibly in this embodiment as well.

In some embodiments of the invention, the fiber-optic sensor can, at least in some portions thereof, be adhered to, welded to, encapsulated by injection molding in or laminated to the battery housing and/or at least one battery cell. The adhesion of the fiber-optic sensor effects an extensive rigid connection between the waveguide and the battery cell and/or the battery housing, as a result of which the fiber-optic sensor undergoes a change in length when the battery cell expands, said change changing the Bragg wavelength of the first fiber Bragg grating. As a result of the adhesion, the fiber-optic sensor becomes an integral component of the battery cell and/or the battery so as to avoid a mechanical damage.

In some embodiments of the invention, the fiber-optic sensor can be embedded in a carrier film. In the final assembly of the battery, the carrier film with the fiber-optic sensor can be adhered to at least one battery cell or the battery housing. If the carrier film becomes smaller upon the action of heat, the carrier film including the fiber-optic sensor can be shrunk onto a battery cell in generally known manner. This allows a simple attachment of the fiber-optic sensor to generally known battery cells, thus also rendering possible the realization of the fiber-optic sensor system according to the invention with generally known components and the production of batteries with and without sensors in a particularly simple way on an assembly line.

In some embodiments of the invention, the carrier film can have surface areas where a fiber reinforcement is introduced. The surface areas having fiber reinforcement are selected in such a way that they can absorb at least some mechanical stresses and thus do not exert, or only exert to a minor degree, an influence on the Bragg wavelength of the second fiber Bragg grating.

In some embodiments of the invention, the carrier film can have a recess, at least the longitudinal portion of the fiber-optic sensor, which contains the second fiber Bragg grating, being arranged in the recess. When the carrier film is adhered to a battery cell, the first fiber Bragg grating is thus connected to the housing of the battery cell in force-fit fashion so as to determine the expansion thereof. However, the second fiber Bragg grating is decoupled from the battery cell in the recess, as a result of which a temperature measurement can be made with high precision.

In some embodiments of the invention, each battery cell of a battery can be associated with at least one first fiber Bragg grating and at least one second fiber Bragg grating. This allows the measurement of the expansion and of the temperature of each individual cell in such a way that the charge currents, discharge currents and the state of discharge can be monitored separately. As a result, individual battery cells of a larger battery can be charged or discharged in optimized fashion or switched off in case of failure. The power and/or the service life of such a battery can be improved by this. Fire detection is also possible by detecting the temperature, as a result of which the battery can be switched off in case of fire and/or an extinguishing device or an alarm can be triggered.

In some embodiments of the invention, the battery also contains an open loop and/or closed loop control device, which is coupled to at least one fiber-optic sensor. This allows a particularly simple handling of the battery which in generally known manner provides merely two terminal contacts, via which a charge current can be supplied or a discharge current can be drawn. The distribution of these currents to the individual battery cells is checked automatically by the open loop or closed loop control device in the battery interior without the user's assistance and by means of the measurement results of the at least one fiber-optic sensor.

BRIEF DESCRIPTION OF THE DRAWINGS

The invention shall be explained in more detail below by means of drawings without limiting the general inventive concept, wherein.

DETAILED DESCRIPTION

Figure 1:
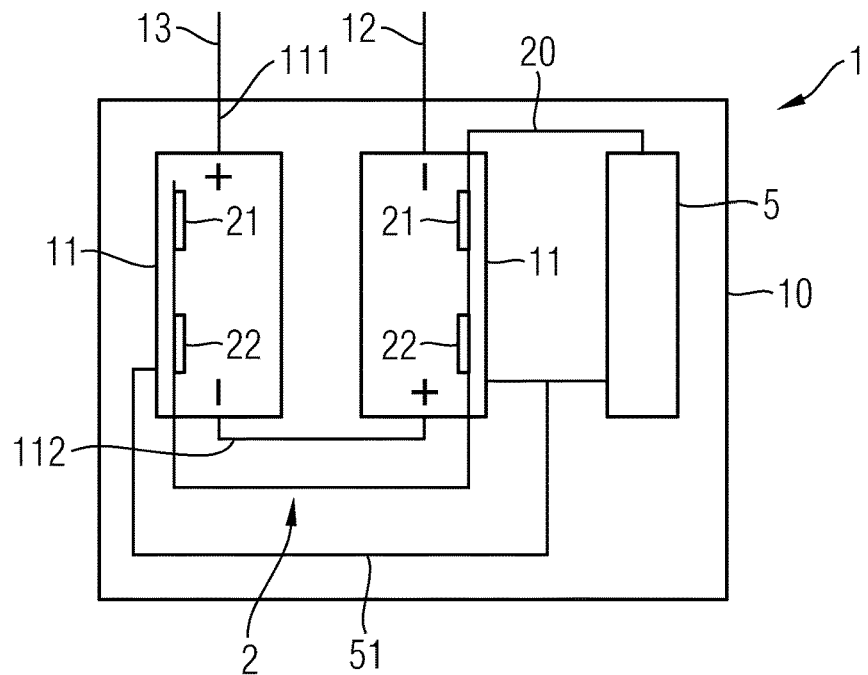
FIG. 1 shows a block diagram of a battery according to the invention.

FIG. 1 shows a block diagram of a battery 1 according to the invention. The battery 1 contains at least one battery cell 11. Some embodiments of the invention can contain a plurality of battery cells 11 which are interconnected to one another in parallel or serially in order to increase the output voltage and/or the output current of the battery cell 1. FIG. 1 illustrates by way of example two battery cells 11, which are interconnected serially, as a result of which it is possible to tap an electric voltage and an electric current at the terminal contacts 12 and 13 of the battery 1.

The battery cells 11 have a first terminal contact and/or a plus pole 111 as well as a second terminal contact and/or minus pole 112. The battery cell 11 can be e.g. a generally known lithium ion accumulator. The battery cell 11 can have a generally known design. In some embodiments of the invention, the battery cell 11 can be a round cell which has an approximately cylindrical basic form.

The state of charge, the charge current and the discharge current of the battery cells 11 are monitored via a fiber-optic sensor 20 in the illustrated embodiment. The fiber-optic sensor 20 has two first fiber Bragg gratings 21 as well as two second fiber Bragg gratings 22. The fiber Bragg gratings are distributed along the longitudinal extension of the waveguide 20, which is part of the fiber-optic sensor 2, in such a way that each battery cell 11 is associated with at least one first fiber Bragg grating 21 and one second fiber Bragg grating 22.

The first fiber Bragg grating is connected to the battery cell 11 in force-fit fashion so as to induce in the case of a mechanical expansion of the battery cell 11 a mechanical stress in the waveguide 20, which changes the Bragg wavelength of the first fiber Brag grating 21. Thus, the expansion and/or circumferential change of the battery cell 11 can be concluded from the modification of the Bragg wavelength.

The second fiber Bragg grating 22 is mechanically decoupled from the battery cell 11. However, the longitudinal portion, which contains the second fiber Bragg grating 22, is thermally coupled to the battery cell 11. Therefore, the temperature of the battery cell can be determined by changing the Bragg wavelength of the second fiber Bragg grating 22.

The four fiber Bragg gratings illustrated in FIG. 1 can be distinguished due to their Bragg wavelength. Therefore, a clear assignment of the measuring site and thus the separate detection of expansion and temperature are possible for both battery cells 11.

The concept shown in FIG. 1 by means of two battery cells can easily be scaled to larger batteries having a plurality of battery cells 11.

The use of fiber-optic sensors has the advantage of better EMC compatibility. Furthermore, many measuring sites can be realized with only some few waveguides 20 and thus with little interconnecting effort in order to also monitor large batteries having many battery cells. Alternatively it is also possible to use generally known strain gages and/or resistance thermometers in order to detect the size changes and the temperature.

The fiber-optic sensor 2 can monitor alternatively or additionally the expansion and the temperature of a battery housing 10 of the battery 1 in the same way as shown for the battery cells 11.

In the embodiment according to FIG. 1, the battery 1 also contains an open loop and/or closed loop control unit 5. For the purpose of simplification, the below text merely refers to an open loop control device 5. This shall always include the alternatives of a closed loop control device and/or a combined open loop and closed loop control device.

The control device 5 can contain, or consist of, e.g. a microprocessor or a microcontroller. Alternatively, the control device 5 can be realized as FPGA or discrete electronic circuit. In the illustrated embodiment, the control device 5 contains a light source and a micro-optical spectrometer in order to directly read out the fiber-optic sensor 2. In other embodiments of the invention, these components can be present in a separate circuit, as a result of which the control device 5 provides the measured values of the fiber-optic sensor 2 as optical or electric data signal.

The control device 5 is also provided with a control line 51, which can influence individual battery cells 11, e.g. via a cut-off relay. Thus, the control device 5 monitors the expansion and temperature of the battery cells 11 during the operation. A charge current and/or discharge current and/or state of charge can be concluded from the expansion and the temperature, e.g. by calculating these values from the input variables in a model of the battery cells 11 or via a conversion table.

In the case of excessive values for the charge current or voltage, an inadmissible temperature increase, overcharge, deep discharge or inadmissibly large expansion, individual battery cells can be separated from the circuit via the control line 51 in order to prevent the damage thereof. It is in particular possible to prevent individual battery cells 11 from catching fire and fire from spreading to the environment of the battery 1 via adjacent battery cells 11.

Figure 2:
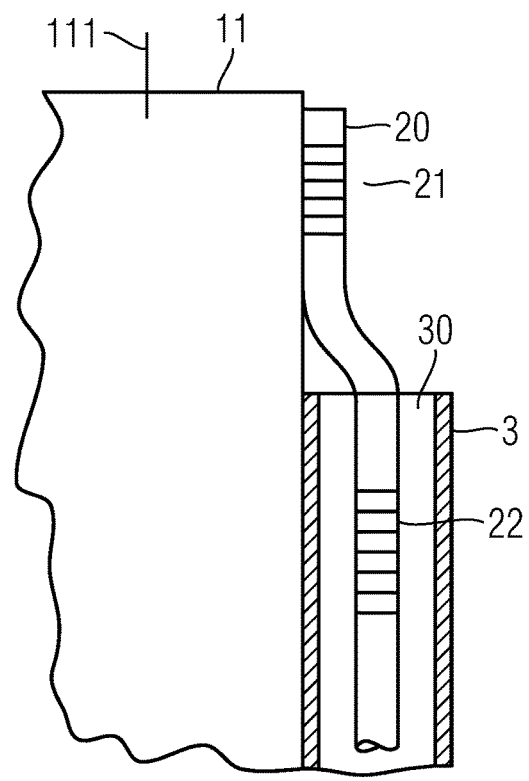
FIG. 2 shows a possible attachment of a fiber-optic sensor to a battery cell.

FIG. 2 shows by way of example an individual battery cell 11 having a first terminal contact 111. At least one waveguide 20 having at least one first longitudinal portion is adhered to the surface of the battery cell 11. The waveguide 20 can be connected to the battery cell 11 by means of adhesion, welding or clamping. This longitudinal portion contains the first fiber Bragg grating 21, as a result of which the grating constant thereof and thus the Bragg wavelength is enlarged when the battery cell 11 expands and is reduced when the battery cells 11 is reduced. As a result, the determination of the Bragg wavelength of the first fiber Bragg grating 21 allows the determination of the expansion of the battery cell 11.

In order to determine the temperature of the battery cell 11, a second fiber Bragg grating 22 is available that is arranged on a longitudinal portion of the waveguide 20, which is mechanically decoupled from the battery cell 11.

The mechanical decoupling can be done via a tube 3, which is attached to the battery cell 11 by means of adhesion or welding and through the interior 30 of which the waveguide 20 is guided. The waveguide 20 is thus freely movable in the interior 30 of the tube 3. In particular, the battery cell 11 can expand without influencing the second fiber Bragg grating 22. However, a thermal coupling of the fiber Bragg grating 22 to the battery cell 11 is simultaneously maintained, as a result of which the temperature thereof can be determined.

Figure 3:
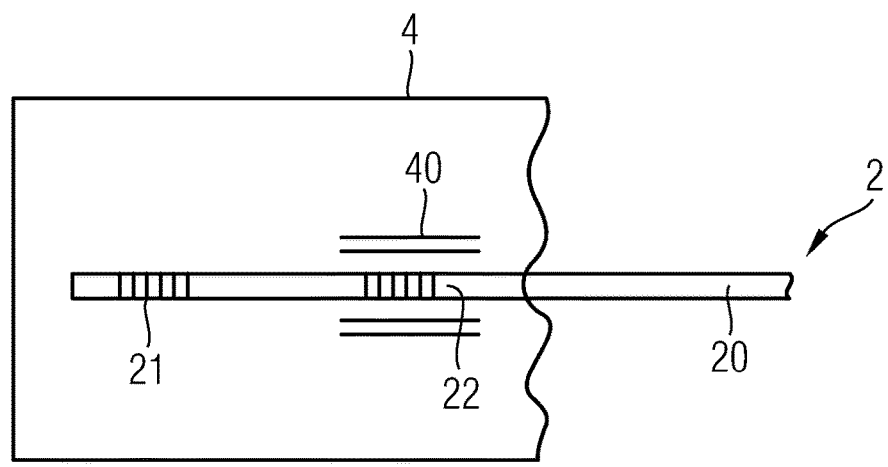
FIG. 3 shows a first embodiment of a carrier film having a fiber-optic sensor.
Figure 4:
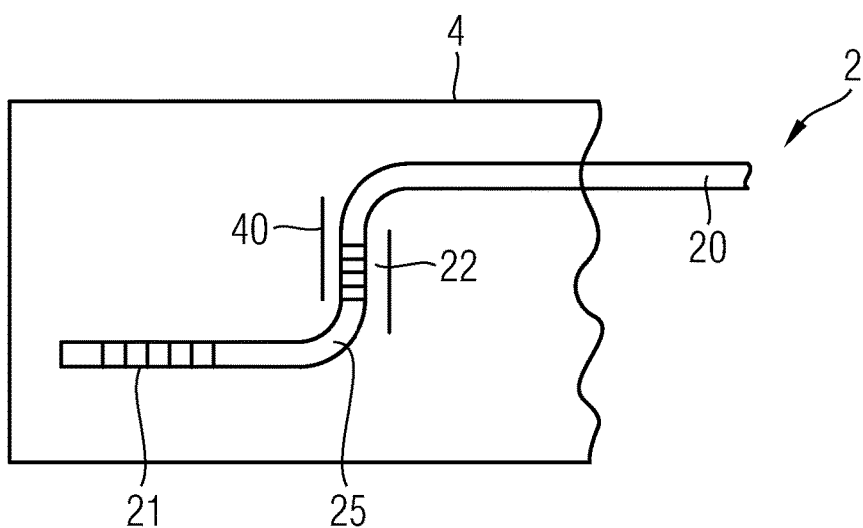
FIG. 4 shows a carrier film having a fiber-optic sensor according to a second embodiment of the invention.

FIG. 3 and FIG. 4 show alternative embodiments of the invention. FIGS. 3 and 4 each show carrier films 4, which have an embedded fiber-optic sensor 2. The carrier films can be connected to a battery cell 11 or a battery housing 10 by adhesion, welding or shrinkage in order to measure the temperature and the expansion of these components. The carrier film 4 has surface areas including a fiber reinforcement 40. The fiber reinforcement 40 covers at least part of the area where the second fiber Bragg grating 22 is arranged. This serves to limit the mechanical expansion of the carrier film 4 in the region of the second fiber Bragg grating 22. There is no such fiber reinforcement in the region of the first fiber Bragg grating 21, as a result of which a greater mechanical stress and thus a greater change in the Bragg wavelength is exerted on the first fiber Bragg grating 21 when the carrier film expands due to an expansion of the battery cell.

In FIG. 4, the waveguide 20 has at least one curve 25, as a result of which the longitudinal portion including the second fiber Bragg grating 22 is approximately orthogonal to the longitudinal portion including first fiber Bragg grating 21. If the carrier film 4 is applied to a round cell in such a way that the first fiber Bragg grating 21 extends radially, the second fiber Bragg grating 22 is aligned axially. Therefore, a greater mechanical stress is exerted on the first fiber Bragg grating 21 when the battery cell 11 expands, as a result of which the expansion can be detected with greater reliability and/or higher accuracy. Since the second fiber Bragg grating 22 is approximately orthogonal to the first fiber Bragg grating 21, it is influenced by the expansion of the battery cell 11 to a smaller extent, and therefore the accuracy of the temperature measurement is increased. This accuracy can even be improved once again by the fiber reinforcement 40.

Figure 5:
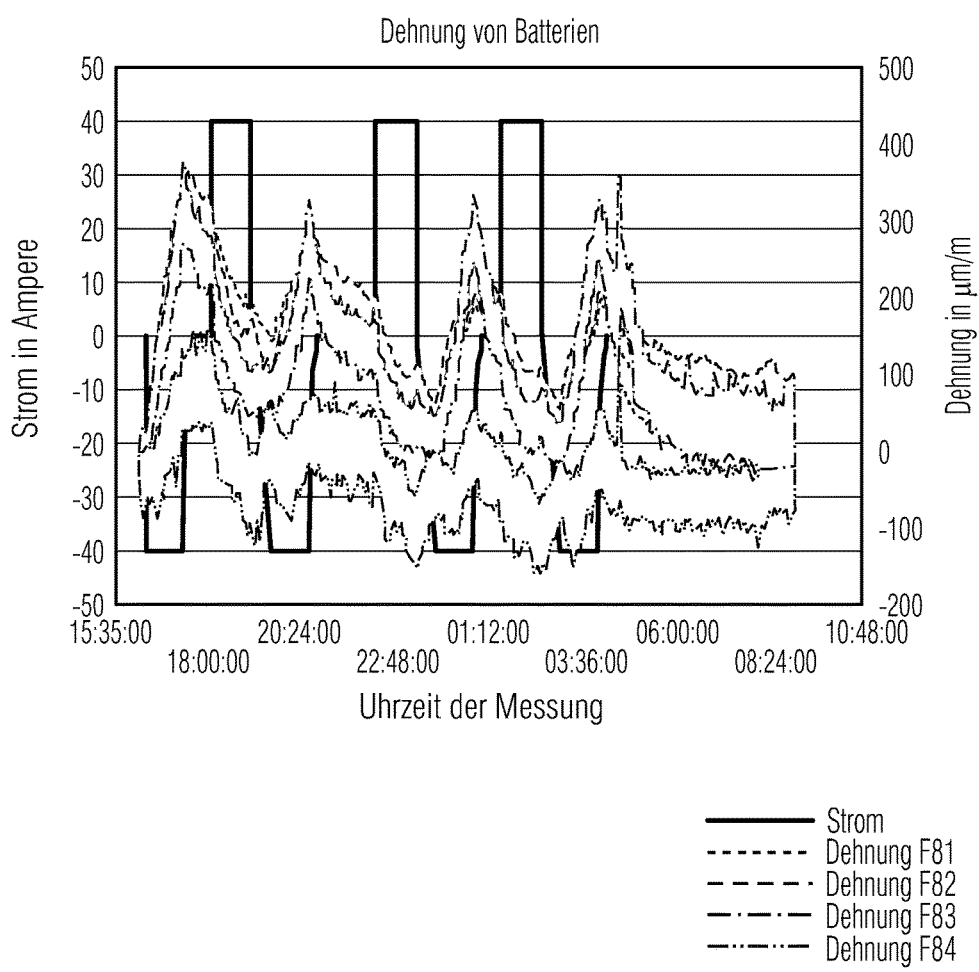
FIG. 5 shows measured values of the expansion of a battery cell in accordance with the electric current.

FIG. 5 shows the current drawn from and/or supplied to a battery on the left-hand ordinate and the measured expansion of the battery cell 11 on the right-hand ordinate. The time is plotted on the abscissa.

Figure 6:
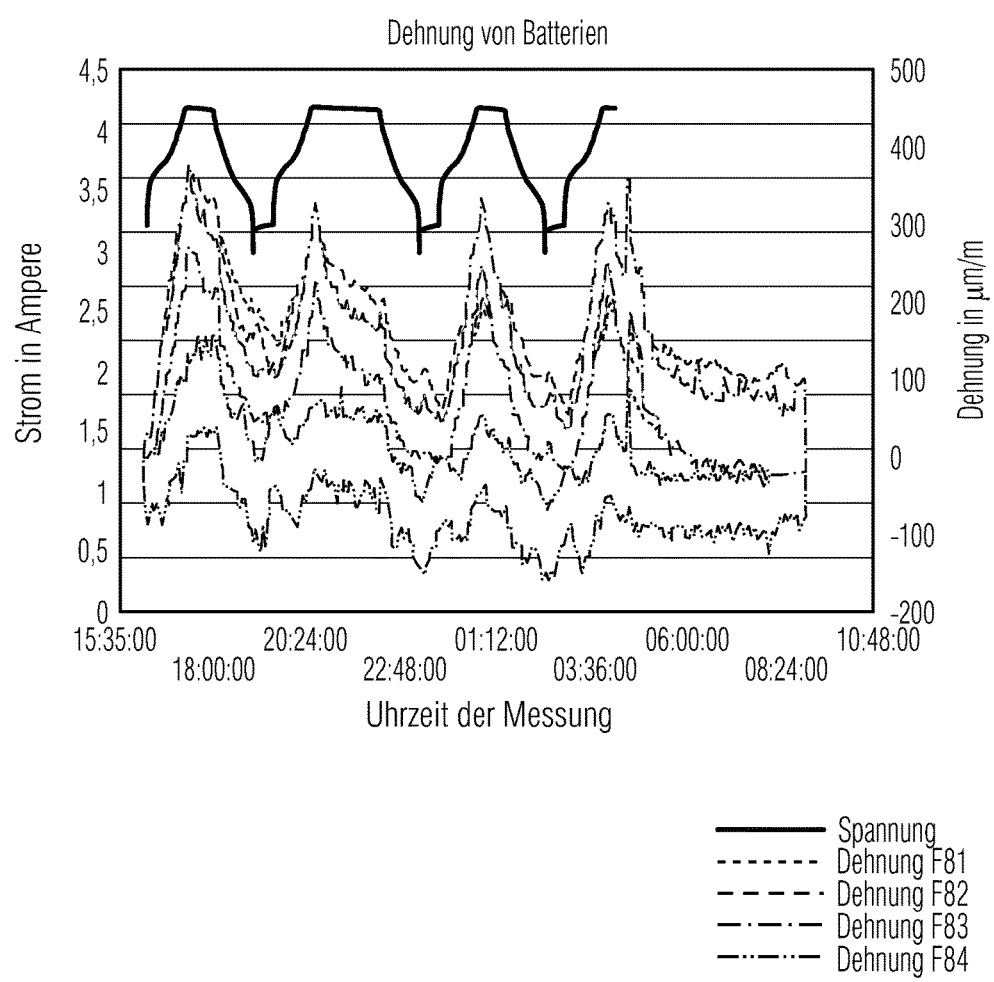
FIG. 6 shows the dependence of the expansion of a battery cell on the electric voltage.

FIG. 6 also shows the time on the abscissa and the expansion on the right-hand ordinate. The voltage of the battery cell is given in volts on the left-hand ordinate.

The battery cell is provided with four first fiber Bragg gratings 21 which are attached to different locations of the battery cell.

A charge current is initially switched on over the course of time and supplied to the battery cell 11. After a charge time, the current is switched off and the battery cell is left up to itself. Then, a discharge current of 40 amperes is drawn for a certain period of time. This cycle is repeated several times.

As shown in FIG. 5 and FIG. 6, the battery cell expands with increasing duration of the state of charge. Switching-off the charge current relaxes the expansion but does not achieve its original value. Therefore, it is possible to conclude the state of discharge from the expansion. During the discharge, the expansion is further reduced until it reaches almost its initial value at the end of the discharge cycle.

As also shown in FIG. 5 and FIG. 6, the surface of the battery cell 11 contains partial areas which have a smaller expansion than other partial areas. These partial areas are therefore particularly suitable to measure the temperature since the measured error can be kept small by large mechanical stresses.

Figure 7:
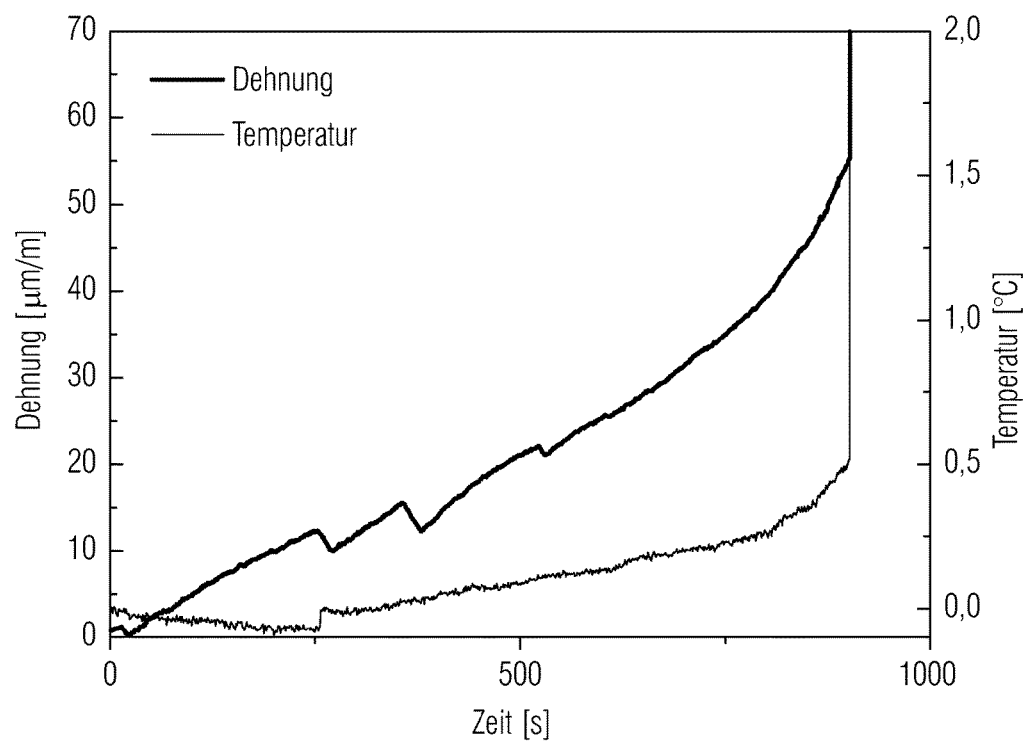
FIG. 7 shows the course of the expansion and the temperature of a battery cell in case of overcharge.

FIG. 7 shows the course of expansion and temperature of a battery cell in the case of overcharge.

The abscissa shows the time in seconds. The left-hand ordinate shows the expansion of the battery cell in $\mu$m/m and the right-hand ordinate shows the course of the temperature of the battery cell. In the illustrated time range there is a continuous overcharge of the battery cell.

As shown in FIG. 7, the temperature is initially only raised by merely about 0.5° C. Only when the overcharge is very high there can be a sudden temperature increase which may cause a fire and thus an emergency. Therefore, the sole monitoring of the temperature can only be used conditionally to predict a defect of the battery cell.

However, if according to the invention the expansion of the cell is detected, a continuous increase in the expansion manifests itself. In the illustrated example, an alarm can already be output at a threshold value of 50 $\mu$m/m and/or the damaged cell can be switched off. Since the proposed fiber-optic sensor has a measurement accuracy of less than 10 $\mu$m/m or of less than 5 $\mu$m/m or less than 2 $\mu$m/m or less than 1 $\mu$m/m, the overcharge and the threatening failure of the battery cell can be reliably detected.

Of course, the invention is not limited to the embodiment shown in the drawings. Therefore, the above description should not be considered limiting but explanatory. The below claims should be comprehended in such a way that a feature mentioned is available in at least one embodiment of the invention. This does not rule out the presence of further features. If the claims and the above description define "first" and "second" features, this designation serves to distinguish two similar features without determining an order.

The invention claimed is:

1. A battery having a battery housing and at least one battery cell and at least one fiber-optic sensor which has at least one waveguide including a core and a cladding surrounding the core, at least one first fiber Bragg grating being introduced in the core, which is mechanically coupled to the battery housing and/or the battery cell in order to detect a size change in the battery housing and/or the battery cell, wherein at least one second fiber Bragg grating is introduced in the core, the second fiber Bragg grating being mechanically decoupled from the battery housing and the battery cell, the waveguide having a longitudinal portion containing the second fiber Bragg grating, said longitudinal portion provided with a fiber reinforcement.

2. The battery according to claim 1, wherein the second fiber Bragg grating is arranged in a cavity.

3. The battery according to claim 1, wherein at least a longitudinal portion of the waveguide, which contains the second fiber Bragg grating, runs in a tube.

4. The battery according to claim 1, wherein the sensor is adhered at least in some portions to the battery housing and/or at least one battery cell.

5. The battery according to claim 1, wherein the sensor is embedded in a carrier film.

6. The battery according to claim 5, wherein the carrier film has spatial areas where a fiber reinforcement is introduced.

7. A battery having a battery housing and at least one battery cell and at least one fiber-optic sensor, which has at least one waveguide having a core and a cladding surrounding the core, at least one first fiber Bragg grating being introduced in the core, said grating being mechanically coupled to the battery housing and/or the battery cell, wherein the sensor is embedded in a carrier film.

8. The battery according to claim 7, wherein at least one second fiber Bragg grating is introduced in the core, the second fiber Bragg grating being arranged in a partial surface of the carrier film where a fiber reinforcement is introduced.

9. The battery according to claim 8, wherein the waveguide has at least one curve, as a result of which the longitudinal portion including the second fiber Bragg grating is approximately orthogonal to a longitudinal portion including the first fiber Bragg grating.

10. The battery according to claim 7, wherein the carrier film is connected to a battery cell or a battery housing by adhesion, welding or shrinkage.

11. The battery according to claim 1, wherein each battery cell of a battery is associated with at least one first fiber Bragg grating and at least one second fiber Bragg grating.

12. The battery according to claim 1, further containing an open loop and/or closed loop control device, which is coupled to at least one sensor.

13. A method for the open loop control or closed loop control of the charging and/or discharging of a battery having at least one battery cell, where measured values are detected by at least one fiber-optic sensor, which has at least one waveguide including a core and a cladding surrounding the core, at least one first fiber Bragg grating being introduced in the core, said first fiber Bragg grating being mechanically coupled to the battery housing and/or the battery cell in order to detect a size change in the battery housing and/or the battery cell, wherein at least one second fiber Bragg grating is introduced in the core of a longitudinal portion of the waveguide, said longitudinal portion of the waveguide provided with a fiber reinforcement, the second fiber Bragg grating being mechanically separated from the battery housing and the battery cell and a size change in the battery housing and/or the battery cell being detected with the first fiber Bragg grating and a temperature being detected with the second fiber Bragg grating.

14. The method according to claim 13, wherein each battery cell of a battery is associated with at least one first fiber Bragg grating and at least one second fiber Bragg grating so as to detect the deformation and the temperature of each battery cell.

15. The method according to claim 13, wherein individual battery cells are switched off when there is a malfunction.

16. The method according to claim 13, wherein a malfunction is assumed when there is an expansion of more than 50 μm/m.

* * * * *